United States Patent
You et al.

(10) Patent No.: US 10,826,810 B1
(45) Date of Patent: Nov. 3, 2020

(54) VERSATILE SIGNAL DETECTOR CIRCUIT USING COMMON MODE SHIFT WITH ALL-PASS CHARACTERISTICS

(71) Applicant: International Business Machines Corporation, Armonk, NY (US)

(72) Inventors: Yang You, Austin, TX (US); Pier Andrea Francese, Adliswil (CH); Glen Wiedemeier, Austin, TX (US); Daniel M. Dreps, Georgetown, TX (US); Chad Andrew Marquart, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/587,949

(22) Filed: Sep. 30, 2019

(51) Int. Cl.
  H04L 12/26 (2006.01)
  H03F 1/08 (2006.01)
  H03F 3/45 (2006.01)
  H03F 1/34 (2006.01)
  H04B 1/16 (2006.01)

(52) U.S. Cl.
  CPC .......... *H04L 43/0876* (2013.01); *H03F 1/08* (2013.01); *H03F 1/34* (2013.01); *H03F 3/45071* (2013.01); *H04B 1/1615* (2013.01); *H03F 2200/129* (2013.01); *H03F 2203/45116* (2013.01); *H03F 2203/45288* (2013.01); *H03F 2203/45528* (2013.01)

(58) Field of Classification Search
  CPC ... H04L 43/0876; H03F 1/34; H03F 3/45071; H03F 1/08; H03F 2203/45288; H03F 2203/45116; H03F 2203/45528; H03F 2200/129; H04B 1/1615
  See application file for complete search history.

(56) References Cited

U.S. PATENT DOCUMENTS

| 7,102,390 | B2 | 9/2006 | Frans | |
|---|---|---|---|---|
| 7,218,146 | B2* | 5/2007 | Shibata | G06F 1/3203 326/82 |
| 8,638,838 | B1 | 1/2014 | Betts | |
| 8,698,540 | B2 | 4/2014 | Morong | |
| 8,908,807 | B2 | 12/2014 | Schoenborn | |
| 9,966,908 | B1 | 5/2018 | Carey | |
| 2013/0147556 | A1* | 6/2013 | Liu | H03F 3/505 330/253 |
| 2013/0251016 | A1* | 9/2013 | Yap | G06F 1/3209 375/224 |

FOREIGN PATENT DOCUMENTS

EP  0416703A2 A1  3/1991

OTHER PUBLICATIONS

Sanad Kawar, A 10Gbps loss of signal detector for high-speed AC-coupled serial transceivers in 20nm CMOS technology, IEEE conference paper May 2014, attached as NPLdocument.

\* cited by examiner

*Primary Examiner* — Vineeta S Panwalkar

(74) *Attorney, Agent, or Firm* — Robert R. Williams

(57) ABSTRACT

A method and apparatus in a receiver to determine if a high speed communication link is in an idle mode or in an active mode. Signals during the idle mode are of lower amplitude and lower frequency compared to amplitude and frequency in the active mode. A signal detector in the receiver determines if the high speed communication link has transitioned from idle mode to active mode and, if so, wakes up high power circuitry in the receiver to receive data.

12 Claims, 9 Drawing Sheets

US 10,826,810 B1

VERSATILE SIGNAL DETECTOR CIRCUIT USING COMMON MODE SHIFT WITH ALL-PASS CHARACTERISTICS

BACKGROUND

High speed wired communication links, e.g., from a first chip's transmitter to a second chip's receiver, consume a significant amount of power. Modern communication links may have an active mode and an idle mode, where, in the active mode data is being sent, and, in the idle mode no data is being sent. In the idle mode, the transmitter may reduce signal amplitude and signal frequency to reduce power. High power circuitry used for receiver signal processing techniques needed for high speed data transmission is not needed in the idle mode where a lower frequency is used, and the high power circuitry may be turned off by techniques such as clock gating or other methods. The receiver must recognize when mode changes from idle to active and enable the receiver's high power circuitry. The receiver may also recognize when mode changes from active to idle and disable the receiver's high power circuitry.

SUMMARY

Embodiments of the invention provide a signal detector that is reliable and programmable to signal a high power receiver to enable (often called "wake up") high power circuitry as a signal amplitude received by the signal detector increases to an amplitude threshold expected for active mode transmission. Common mode of a differential signal is programmable in the signal detector. Because frequency of an incoming signal in idle mode may be far lower than frequency of the incoming signal in active mode, embodiments of the invention include an all-pass filter so that a correct interpretation of the incoming signal can be examined to determine whether the amplitude of an incoming signal received by the signal detector is greater than a predetermined amplitude threshold. When that happens, the signal detector asserts a signal to the high power receiver to enable ("wake up") high power circuitry in the high power receiver.

In an embodiment, the signal detector detects when the amplitude of the incoming signal is lower than the predetermined amplitude threshold and asserts a signal to the high power receiver to disable the high power circuitry in the high power receiver.

In an embodiment, to save power in the active mode, the signal detector is disabled, that is, placed in a low power mode where the signal detector is not evaluating voltage levels on the inputs. The transmitter signals the high power receiver that active mode is ending and will transition to idle mode. The high power receiver will respond to this signal by enabling ("waking up") the signal detector when idle mode is established, at which time the high power receiver turns off the high power receiver's high power circuitry. The signal detector then watches for the signal amplitude to again rise past the amplitude threshold for active mode signals. In an illustrative example, signal detector power may be about $\frac{1}{20}$ power of the high power receiver, so a power savings of about 5% can be achieved in this embodiment.

DETAILED DESCRIPTION

Embodiments presented in this detailed description explain how a signal detector may accommodate great differences in amplitude and frequency on a channel. A distal transmitter may send a signal having a first frequency and a first amplitude during an idle mode, and a second signal having a second frequency and a second amplitude during an active mode. The first frequency and the first amplitude are lower than the second frequency and the second amplitude, respectively. First and second frequencies and first and second amplitudes may be different for different signaling protocols used by particular transmitters. High frequency is typically in the gigahertz range, for example one GHz to 50 GHz in current technologies, but higher frequencies are contemplated in future technologies. Low frequency may be in the tens of megahertz. Size of capacitors large enough to pass low frequency signals without significant distortion is area prohibitive.

Embodiments of the invention provide a signal detector which may be included as a part of a receiver. The signal detector detects an amplitude of an input differential signal in a high speed data link channel. Embodiments of the invention enable a wide input common mode operation range on a differential signal input. The signal detector provides two paths; a first path for low frequency signals and a second path for high frequency signals, thereby creating an all-pass filter.

Figure 1:
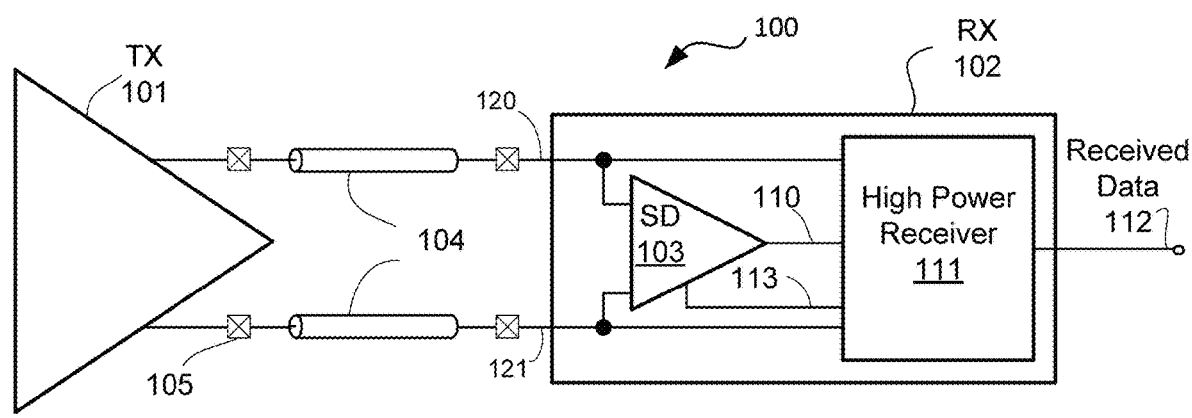
FIG. 1 is a schematic of a system having a differential transmitter (TX) on a first chip connecting to a differential receiver (RX) on a second chip, the receiver on the second chip comprising a signal detector coupled to a high power receiver.

With reference to FIG. 1, a communication system 100 includes a transmitter (TX) 101 to transmit a differential signal over a channel 104 to a receiver (RX) 102. Connector 105 (only one referenced) is a connector through which the differential signal passes. The differential signal has nodes referenced as input plus phase 120 and input minus phase 121. RX 102 may comprise a signal detector (SD) 103 and a high power receiver 111. Signal detector 103 and high power receiver 111 are coupled to input plus phase 120 and input minus phase 121. Signal detector 103 provides a signal on signal detector out 110 to high power receiver 111. A logical value on signal detector out 110 enables ("wakes up") and an opposite phase of the logical value disables ("sleeps") high power circuitry (such as signal processing circuitry) in high power receiver 111. When high power circuitry in high power receiver 111 is enabled (i.e., during active mode), high power receiver 111 sends data received from TX 101 on received data 112 to logic circuits that require the data.

In an embodiment, to save power during active mode, signal detector 103 may be disabled by a signal from high power receiver 111 on signal 113.

Figure 2:
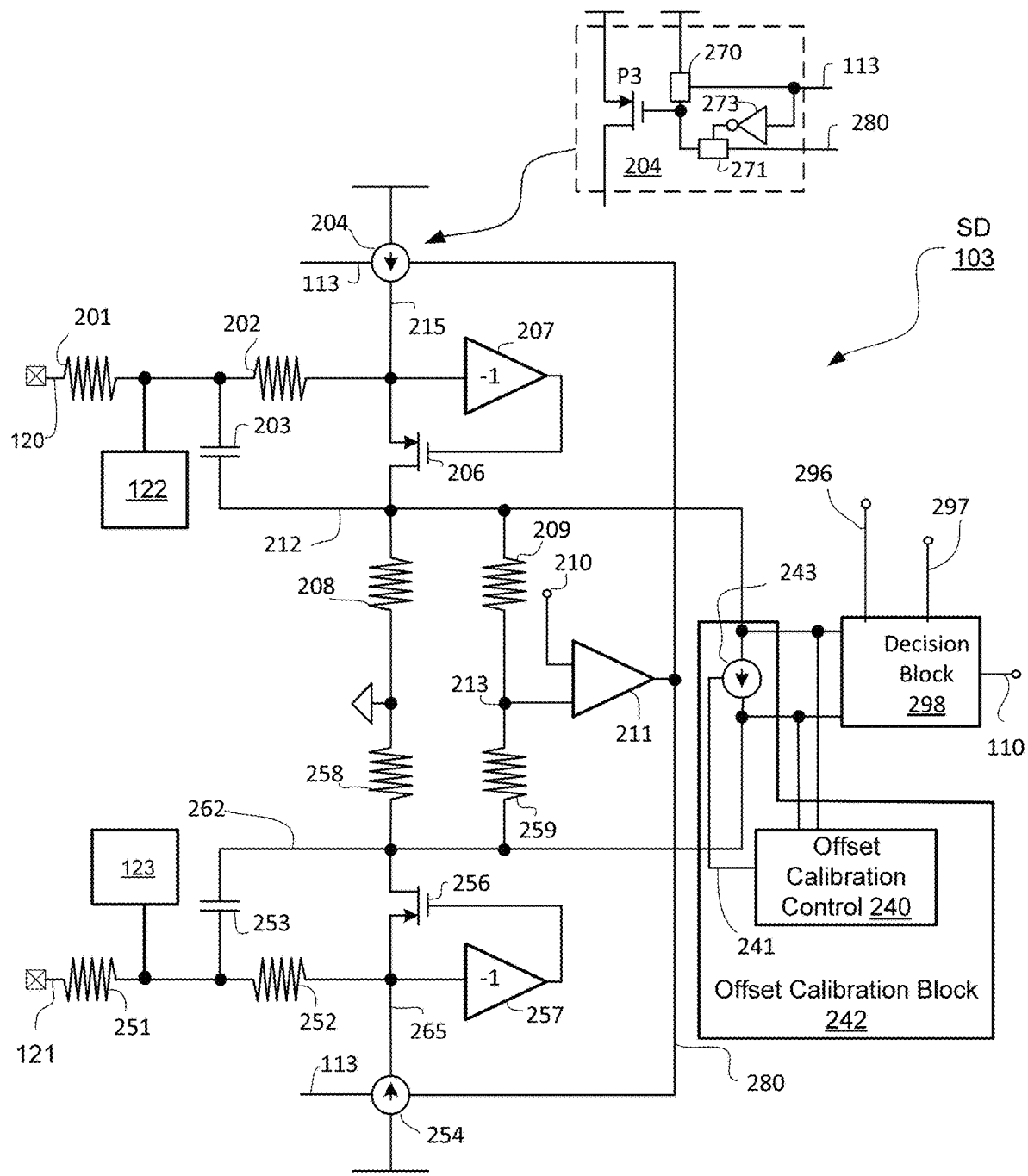
FIG. 2 is a schematic of a signal detector (SD) to monitor a differential signal received and determine whether the differential receiver should be in active or idle mode.

With reference now to FIG. 2, a schematic of signal detector 103 is shown.

Signal detector 103 may comprise five sub-circuits.

(1) Protection from electrostatic discharge (ESD) events includes ESD resistors 201, 251 and ESD circuitry 122 and 123 which provide electrostatic discharge protection for input plus phase 120 and input minus phase 121 respectively. Many forms of ESD protection are known and subcircuit (1) is shown for completeness.

(2) A common mode shifter shifts an input common mode voltage of a differential signal at input pins input plus phase 120 and input minus phase 121 to a programmable common mode level for a shifted differential signal comprising shifted common mode plus input 212 and shifted common mode minus input 262. Shifted common mode voltage is set by common mode reference 210 which is an input to signal detector 103. Voltage for common mode reference 210 is a shifted common mode voltage to which the common mode of the differential signal at inputs 120 and 121 are shifted. The common mode shifter comprises two identical circuits, one for input plus phase 120 and one for input minus phase 121. Current sources 204 and 254 are controlled by a shared control signal on node 280 generated by amplifier 211. In the embodiment where signal detector 103 is disabled by high power receiver 111 using a signal on node 113, current sources 204 and 254 may be shut off using the circuitry shown in the expansion of current source 204. Field Effect Transistor (FET) P3 may be turned off by coupling a gate on P3 to Vdd via transfer gate 270 during active mode and coupling the gate of P3 to node 280 via transfer gate 271 which is controlled by an inverted (inverter 273) version of signal 113 during idle mode. Identical circuitry, for simplicity not shown, would be used for current source 254 in this embodiment. Two identical common mode voltage extraction resistors 209 and 259 share a common node 213 as shown in FIG. 2 to provide a first input to amplifier 211. Second nodes of resistors 209 and 259 are coupled, respectively, to shifted common mode plus input 212 and shifted common mode minus input 262 as shown in FIG. 2. A second input to amplifier 211 is common mode reference voltage 210 as noted above. Amplifier 211 may have a wide frequency operation range to suppress AC components of the input common mode. Two identical loading resistors 208 and 258 have a shared node connected to ground and second nodes of loading resistors 208 and 258 are coupled, respectively, to shifted common mode plus input 212 and shifted common mode minus input 262 as shown in FIG. 2. Integration of the common mode shifter with a third sub-circuit will be explained below.

(3) An all-pass filter combines a low frequency path and a high frequency path so that fidelity of the signal is maintained from DC to a frequency at least as high as required by a specific protocol to carry mode change information. The all-pass filter includes sense resistors 202 and 252; amplifiers 207 and 257; source followers 206 and 256; and loading resistors 208 and 258. A high frequency path includes AC coupling capacitors 203 and 253 and loading resistors 208 and 258. The all-pass filter passes signals from DC (in practice TX 101 will be sending a relatively low frequency, low amplitude, signal in the kilohertz to tens of megahertz range in idle mode) to a frequency used in active mode (higher amplitude and frequency in the gigahertz range) from input pins input plus phase 120 and input minus phase 121 to nodes shifted common mode plus input 212 and shifted common mode minus input 262.

(4) An offset calibration block 242 further comprising offset calibration control 240 and controllable current switch 243 is shown in FIG. 2. Further detail is shown of these items in FIG. 4. Offset calibration block 242 eliminates any effects on DC voltages from mis-tracking between components used to create a correct common mode voltage for the differential signal on shifted common mode plus input 212 and shifted common mode minus input 262 which should be at the same DC voltage.

(5) Decision block 298 compares the input differential amplitude between nodes shifted common mode plus input 212 and shifted common mode minus input 262 with programmable voltage references for amplitude of the input differential signal. These programmable voltage references are connected to inputs 296 and 297. Depending on the outcome of the compare, decision block 298 asserts a digital output signal detector out 110. If the differential amplitude is larger than the references 296 and 297 (active mode), then signal detector out 110 is set at a value to enable high power receiver 111. If the differential amplitude is smaller than the references at inputs 296 and 297 (idle mode), then signal detector out 110 is set at a value to disable high power receiver 111.

ESD resistors 201 and 251, along with sense resistors 202 and 252 are designed to be much larger than both TX 101 and RX 102 terminations (neither shown; transmitter and receiver terminations are well known in the art). Therefore, they provide a good isolation of signal detector 103 in order not to disturb signal integrity on channel 104.

The common mode shift is accomplished by a common mode feedback loop. The common mode voltage for a differential signal at nodes 212 and 262 is first extracted at node 213, where it is compared against reference voltage 210 by amplifier 211. If the voltage at node 213 is larger than common mode reference voltage 210, the amplifier will generate its output at node 280 in such a way that it reduces the current in current sources 204 and 254. The majority of current from current sources 204 and 254 is converted to voltage at nodes shifted common mode plus input 212 and shifted common mode minus input 262 by loading resistors 208 and 258. As a result, the common mode voltage for a differential signal on nodes shifted common mode plus input 212 and shifted common mode minus input 262 decreases. On the other hand, if the voltage at node 213 is smaller than common mode reference voltage 210, amplifier 211 will generate its output at node 280 to increase the current in current sources 204 and 254. As a result, the common mode voltage for a differential signal on nodes shifted common mode plus input 212 and shifted common mode minus input 262 increases. In this manner, the common mode voltage for a differential signal on nodes shifted common mode plus input 212 and shifted common mode minus input 262 is driven to common mode reference voltage 210. It is contemplated that this common mode feedback loop could also be implemented in a digital way, where the amplifier could be replaced by a comparator and a finite state machine. In such case, the common mode voltage for a differential signal on nodes shifted common mode plus input 212 and shifted common mode minus input 262 is driven to common mode reference voltage 210 in a discrete fashion.

The low frequency signal path works by first creating virtual ground nodes 215 and 265 by a local feedback loop of inverting amplifiers 207 and 257. Inverting amplifiers 207 and 257 have gains >>1, for example 20 or greater. This local feedback loop creates a shunt-series feedback between input current through sense resistors 202 and 252 and output current through loading resistors 208 and 258. The shunt-series feedback lowers the input impedance at nodes 215 and 265 so that the voltage at nodes 215 and 265 can be held independent from the voltage at inputs 120 and 121. In such a way, the input differential voltage signal can be converted to input current without loss in the sense resistors 202 and 252. Since the shunt-series feedback lowers the input impedance of source followers 206 and 256, most of the input current will be pushed towards loading resistors 208 and 258 instead of the parasitic impedance of current sources 204 and 254. Loading resistors 208 and 258 then convert the current back to the voltage at nodes shifted common mode plus input 212 and shifted common mode minus input 262. Thus, the "DC" path is like a low-pass filter with DC gain of (loading resistor 208)/(sense resistor 202) and dominate pole at 1/(capacitor 203*loading resistor 208), given common mode extraction resistor 209 is much larger than loading resistor 208. Loading resistor 258, sense resistor 252, common mode extraction resistor 259, and capacitor 253 perform the same low-pass filter for the minus phase.

Figure 7:
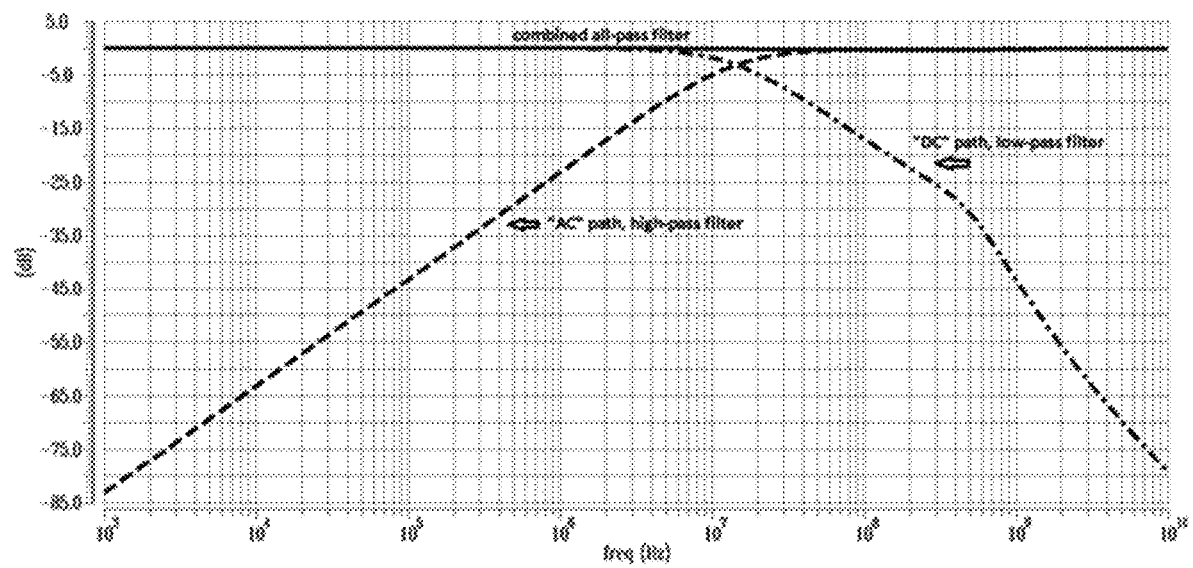
FIG. 7 shows a Bode plot with high frequency and low frequency responses from a simulation of the embodiment described herein.
Figure 8:
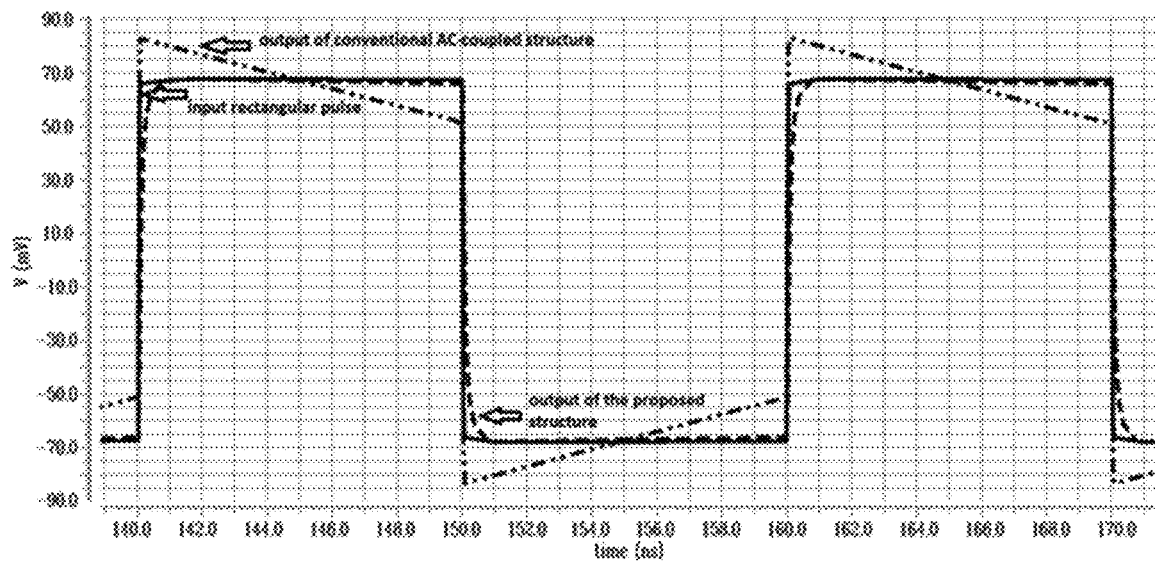
FIG. 8 shows a simulation of a low frequency signal when only a high frequency path is provided in a signal detector.

The high frequency ("AC") signal path is a high-path filter formed by capacitors 203, 253 and loading resistors 208, 258. The corner frequency is also at 1/(capacitor 203*loading resistor 208), and at 1/(capacitor 253*loading resistor 258), respectively. Therefore, combining the low frequency and high frequency paths together achieves an all-pass filter from zero hertz to a high frequency (i.e., frequency of data transmission in active mode). FIG. 7 is a Bode plot showing frequency response of the low frequency and high frequency signals from the all-pass filter described above; the combined all-pass frequency response being flat. FIG. 8 further shows the advantage of this all-pass filter by comparing the differential output waveform distortion between the waveform measured at nodes shifted common mode plus input 212 and shifted common mode minus input 262 and a conventional high-pass filter with simple capacitive coupling at an idle frequency of 50 MHz, using capacitors of a size affordable on a silicon chip.

As is well known in the art, manufacturing tracking mismatches may cause small differences between devices designed to be identical. For example, loading resistor 208 may not be exactly the same as loading resistor 258; current source 204 may not be exactly the same as current source 254; sense resistor 202 may not be exactly the same as sense resistor 252; and so on. For optimal performance, DC voltage on nodes shifted common mode plus input 212 and shifted common mode minus input 262 should be the same and it may be beneficial to control any offset between DC voltages at nodes shifted common mode plus input 212 and shifted common mode minus input 262. Offset calibration control 240 may be used to offset these DC voltage differences.

Figure 3:
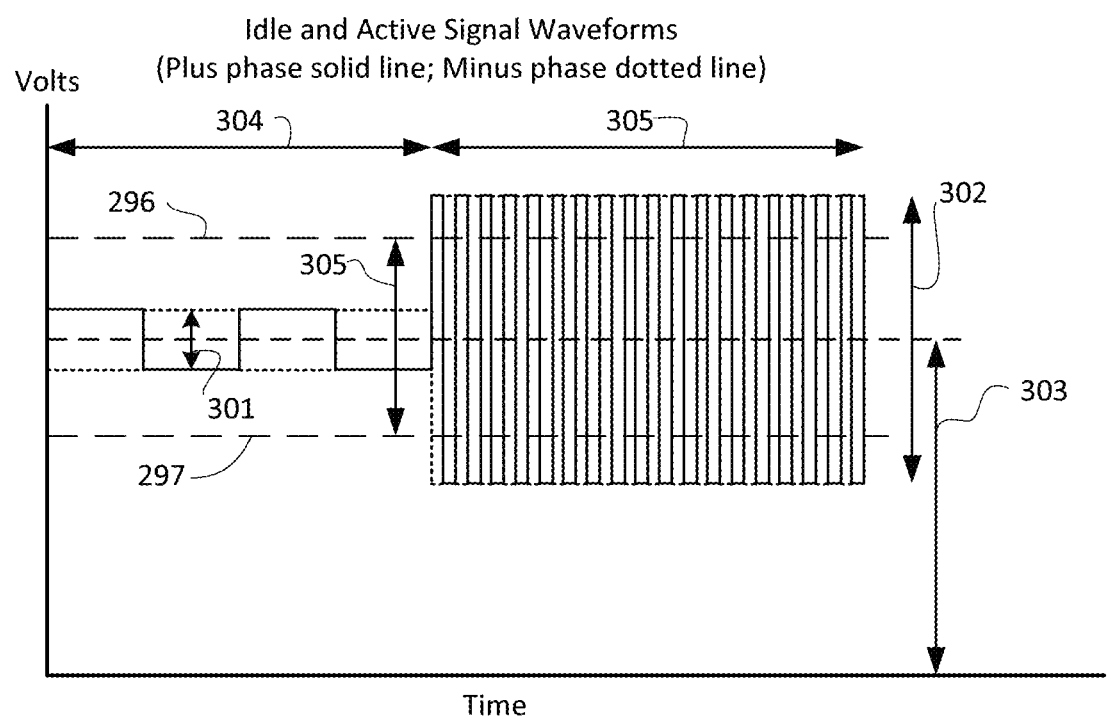
FIG. 3 shows a waveform of an exemplary idle mode amplitude and frequency received by the signal detector. When the incoming signal amplitude becomes greater than a predetermined threshold, the signal detector enables the high power receiver.

FIG. 3 depicts waveforms of a differential signal on an exemplary channel of a high speed link. The plus phase is shown as a solid line waveform; the minus phase is shown as a dotted line waveform. In idle mode, an idle mode amplitude 301 is shown to be used during idle mode 304. Frequency is low, for example 50 MHz, but could be higher or lower. During active mode 305, the input signal is shown as active mode amplitude 302 which is larger than idle mode amplitude 301. Frequency during active mode is generally much higher than frequency during idle mode; active mode frequency in current technology is often 1 GHz to 50 GHz and is expected to be faster in the future. Common mode voltage 303 is illustrated and has the meaning understood in the art. Dashed lines 296 and 297 are the reference voltages shown to be inputs to decision block 298 in FIG. 2. When input signal amplitude 302 is greater than the difference 305 between inputs 296 and 297, decision block 298 asserts a signal on signal detector out 110 to cause high power circuitry in high power receiver 111 to be enabled.

Figure 4:
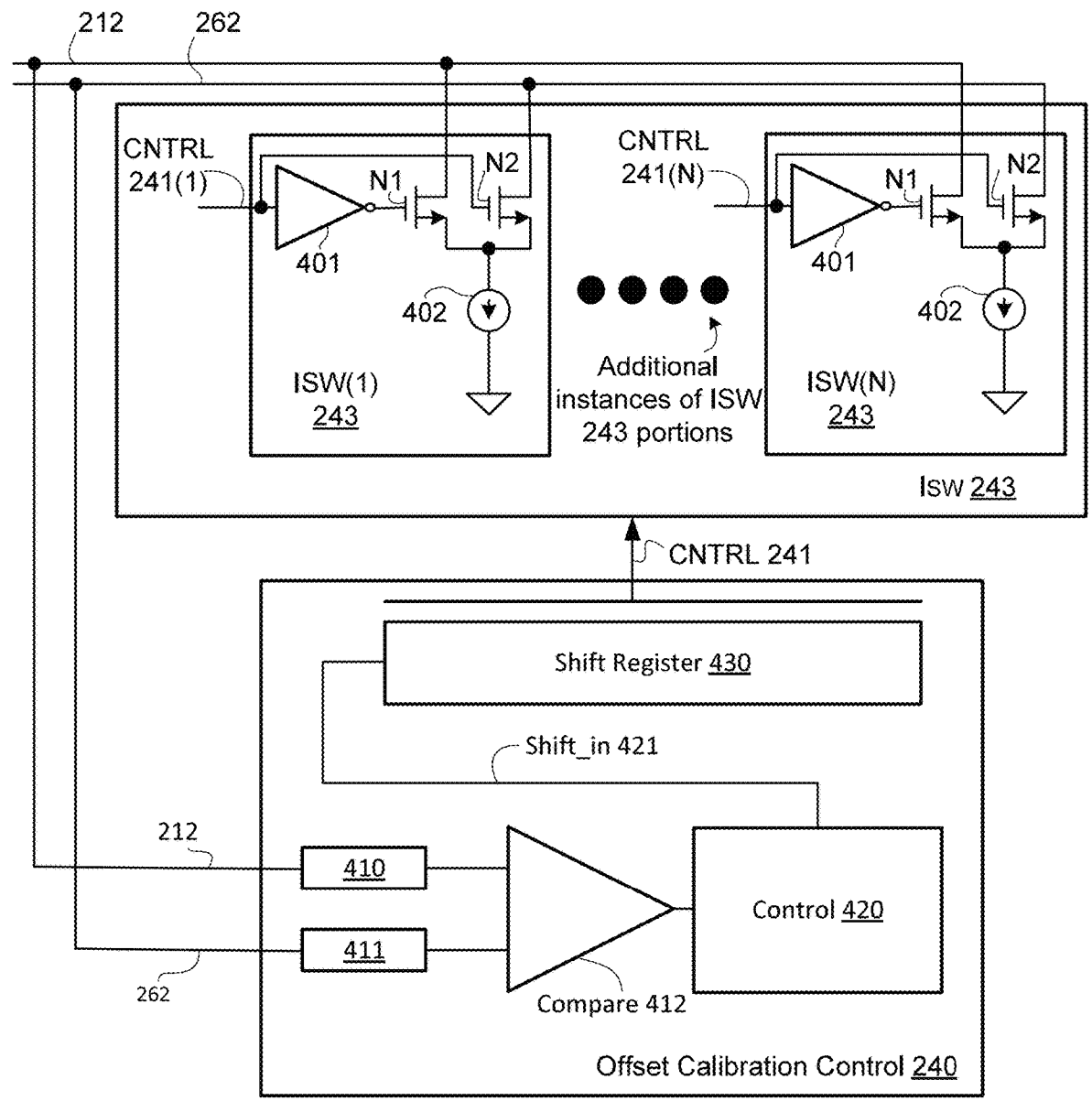
FIG. 4 shows details of circuitry that may be used in the signal detector to accommodate mistrackings and minimize a DC differential offset.

FIG. 4 shows an embodiment of offset calibration block 240 which comprises sub-blocks offset calibration control 240 and current switch ISW 243 as shown in FIG. 2. The purpose of offset calibration control 240 is to swap small amounts of current between shifted common mode plus input 212 and shifted common mode minus input 262 until DC offset voltages are as close to zero as a designer chooses to make them. Offset calibration control 240 comprises a first DC voltage extractor 410 and a second DC voltage extractor 411 to get a first DC voltage from shifted common mode plus input 212 and a second DC voltage from shifted common mode minus input 262 and output these DC voltages to compare 412 to determine which of the first and second DC voltages is higher. Compare 412 passes a logical signal to control 420 to indicate which DC voltage is higher, e.g., a "1" if the first DC voltage is higher; otherwise, a "0". At a beginning of calibration, control 412 shifts in a first logical value (e.g., "1") into shift register 430 via shift in 421 to initialize all bits in shift register 430 to "1". CNTRL 241 is a bus having a bit (e.g., 1 . . . N) for each bit of an "N" bit shift register 430. Continuing the example of an "N" bit shift register are "N" instances (portions) of switch ISW 243. ISW(1) 243 receives CNTRL 241(1). Inverter 401 provides an inversion of CNTRL 241(1) and applies this inversion to a gate of NFET (N channel Field Effect Transistor) N1. CNTRL 241(1) is applied to a gate of NFET N2. Current source 402 provides a current to sources of N1 and N2. Drains of N1 and N2 are coupled to shifted common mode plus input 212 and shifted common mode minus input 262, respectively, as shown in FIG. 4. If CNTRL 241(1) is a "1", current from current source 402 will be taken from shifted common mode minus input 262; if CNTRL 241(1) is a "0", current from current source 402 will be taken from shifted common mode plus input 212. In other words, based on CNTRL 241(1), ISW(1) 243 "swaps" current between nodes 212 and 262. The additional instances (portions) of ISW 243 operate the same way, according to value of the bit of CNTRL 241 they receive. Therefore, since, in the example, all bits of CNTRL 241 are initialized to "1", current from all instances of current source 402 will be drawn from shifted common mode minus input 262, lowering the DC voltage of shifted common mode minus input 262. Control 420 then repeatedly shifts a "0" into shift register 430 until the DC voltage of shifted common mode plus input 212 becomes lower than the DC voltage of shifted common mode minus input 262 at which time the calibration is complete. Value of "N" is a designer choice based on precision desired in removing offset in DC voltages. "N" and current sources 402 must be large enough to accommodate a maximum mis-match in DC voltages.

DC extractors 410 and 411 may be any DC level extractor known in the art. For one example, a relatively high value resistor between an input and a capacitor may be used. The capacitor averages the input waveform, and, since DC extractor 410 (and 411) drives into a high impedance input of comparator 412, decay of voltage on the capacitor would be very small, even for low frequency signals at the input to DC extractor 410 (and 411).

An amplifier or cascode FET (not shown) may be added between shifted common mode plus input 212 and shifted common mode minus input 262 to reduce loading on those nodes by offset calibration block 242.

Figure 5:
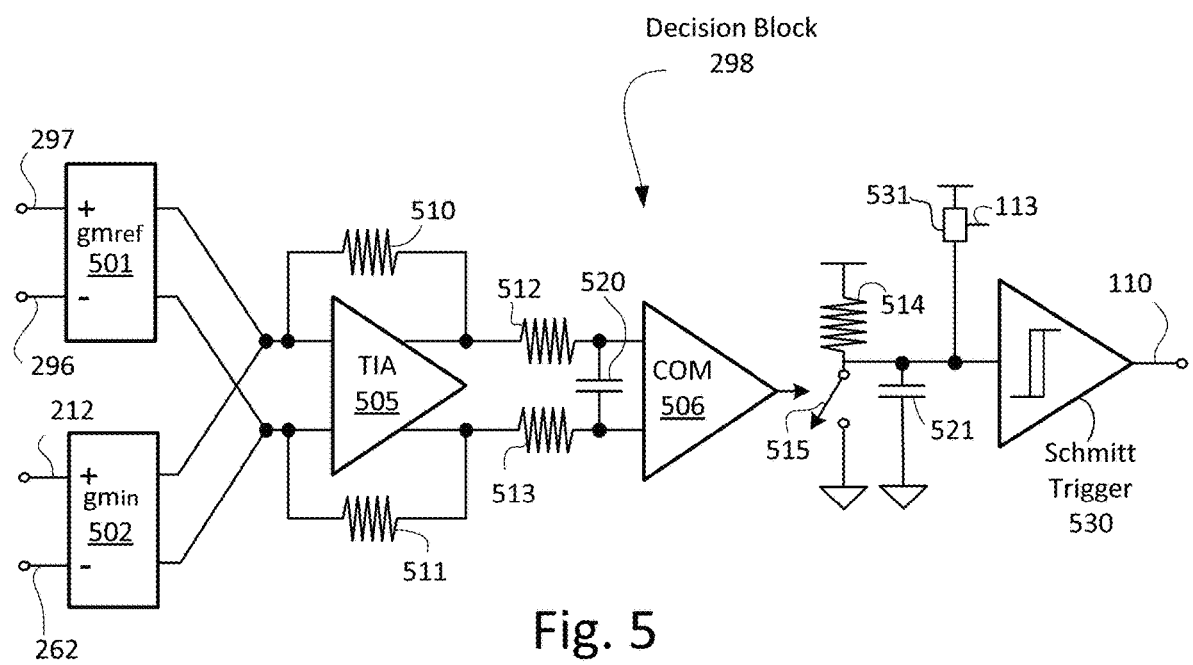
FIG. 5 shows a schematic of circuitry in a decision block to determine amplitude of a shifted common mode signal and control a logical value that is used to enable or disable high power circuitry in the receiver

With reference now to FIG. 5, details of decision block 298 are explained. Decision block 298 receives shifted common mode plus input 212, shifted common mode minus input 262, a plus phase amplitude reference voltage 296 and a minus phase amplitude reference 297. Decision block 298 outputs signal detector out 110 which is used by high power receiver 111 to enable high power circuitry when signal detector 103 has determined that transmitter TX 101 is in active mode and to disable high power circuitry when signal detector 103 has determined that transmitter TX 101 is in idle mode.

Decision block 298 comprises two identical transconductance (GM) blocks 501 and 502, a transimpedance amplifier (TIA) 505 stage, a filter stage, a voltage comparator 506, an I-over-C block, and a Schmitt trigger 530.

GM 501 converts voltages at plus phase amplitude reference voltage 296 and minus phase amplitude reference 297 into currents with equal gain. GM 502 converts voltages at shifted common mode plus input 212 and shifted common mode minus input 262 into currents with equal gain. As shown in FIG. 5, the two differential current signals subtract from each other at the outputs of GM 501, and GM 502 and the difference is converted back to voltage by TIA (transimpedance amplifier) 505 and resistors 510 and 511. During any time interval when the voltage difference between shifted common mode plus input 212 and shifted common mode minus input 262 is larger than the voltage difference between reference voltage 296 and a minus phase amplitude reference 297, TIA 505 produces a high voltage pulse at the output of comparator 506. Therefore, when the input amplitude of an incoming signal is larger than the reference, a series of pulses will be fed into an I-over-C block comprising resistor 514, capacitor 521 and switch (e.g., an FET) 515 to discharge capacitor 521. The discharging overweighs the tie-high resistor 514 to keep the input of the Schmitt trigger low. As a result, a stable digital output is available at signal detect 110, indicating to high power receiver 111 that the transmitter is in active mode and therefore, high power circuitry must be enabled. While an I-over-C block is shown for exemplary purposes, other known circuits that provide a ratio of time that one input to comparator 506 is greater than the other input to comparator 506 is contemplated.

On the other hand, when the signal amplitude received by signal detector 103 is smaller than the reference, the output of comparator 506 stays low so that the switch 515 remains open and resistor 514 will keep the input of Schmitt trigger 530 high. A low-pass filter stage comprising resistors 512 and 513 and capacitor 520 can be added between TIA 505 and comparator 506 to filter out high-frequency noise coming from channel 104.

FIG. 5 shows transfer gate 531, controlled by signal 113, used to hold the input to Schmitt trigger 530 at a high level in an embodiment where signal detector 103 is disabled during active mode.

Figure 9:
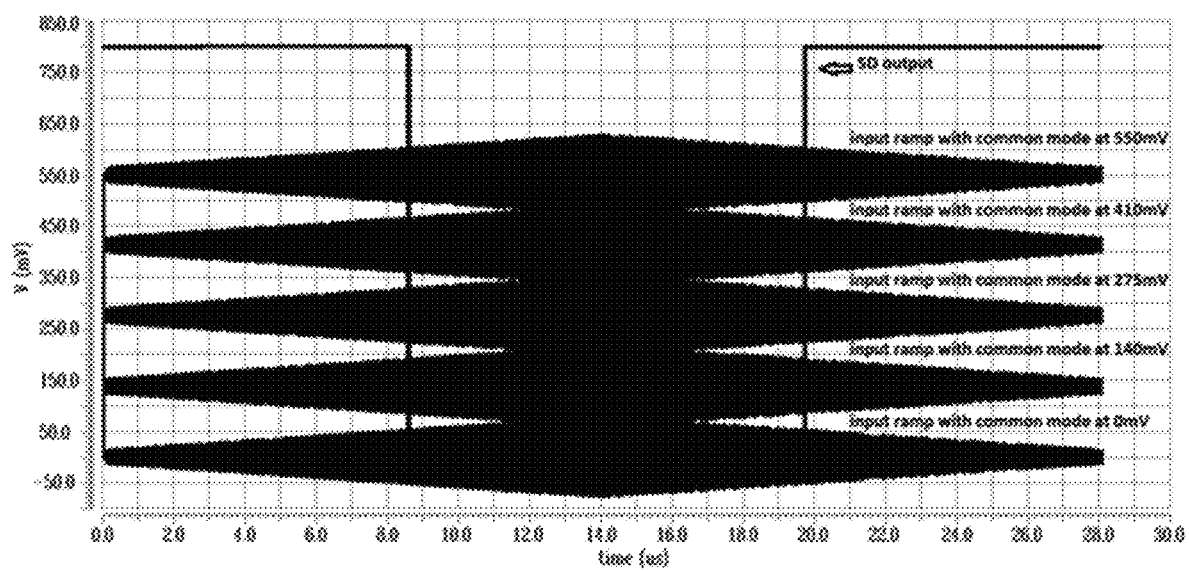
FIG. 9 shows a simulation composite of the signal detector for various common modes and amplitudes.

FIG. 9 shows a simulation result of an embodiment of the invention in which the input signal common mode voltage is set at five different levels from 0.0 volts to 0.550 volts. The input (at nodes 120 and 121) amplitude is ramping up gradually. When it becomes larger than the reference voltage (reference voltage inputs 296 and 297), signal detect output 110 flips from high to low. As the input voltage is then gradually reduced, signal detect output 110 flips from low to high when the input amplitude falls below the reference. The simulation shows that the simulated embodiment of the invention is able to work at all the input common mode levels and the signal detect output 110 flips at almost the same time, meaning the input common mode is not affecting the signal detector 103 performance.

Figure 6:
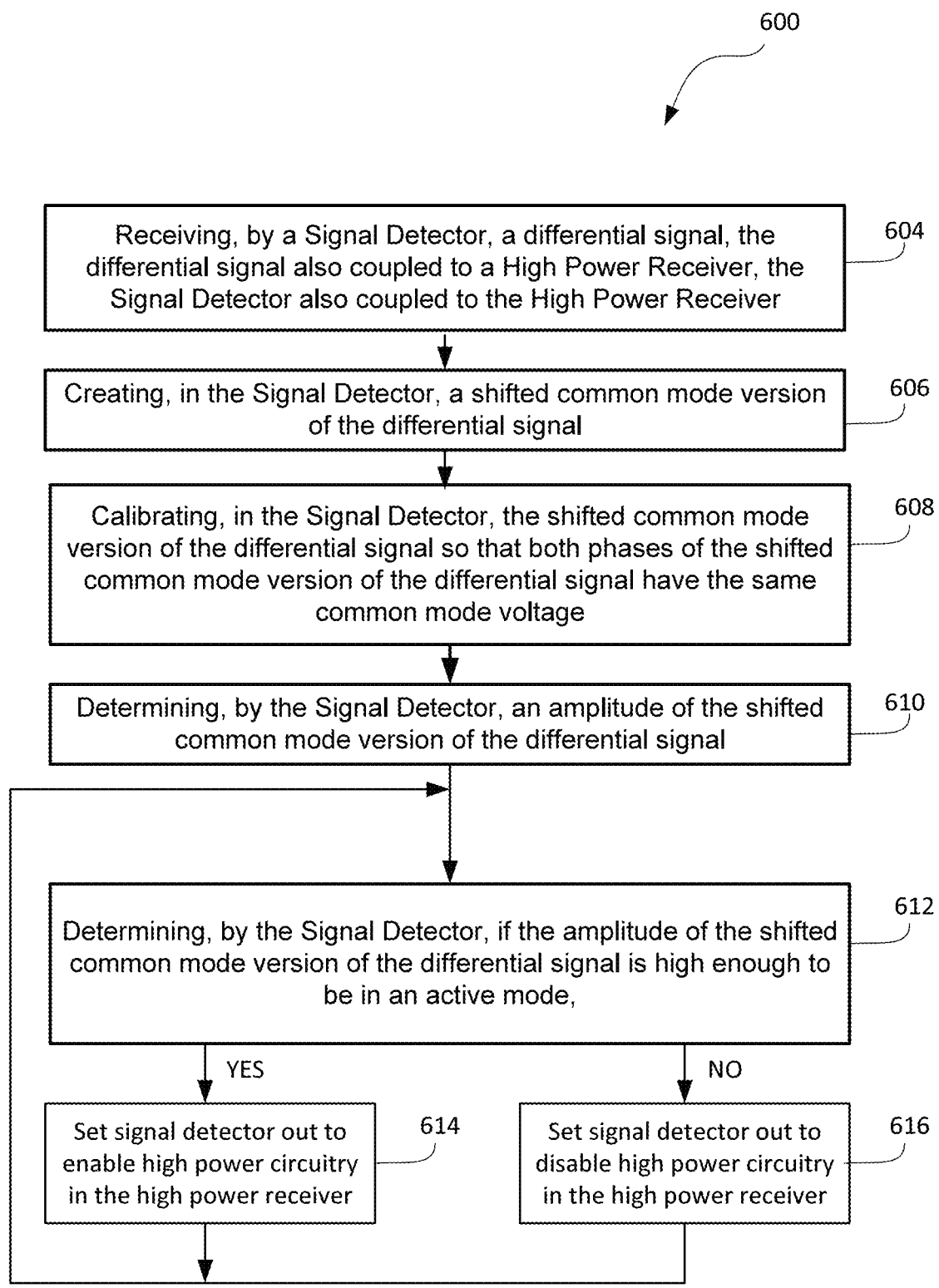
FIG. 6 is a high level flow chart of the signal detector.

FIG. 6 shows a method embodiment 600 of the invention.

Step 604 provides receiving, by a signal detector, a differential signal, the differential signal also coupled to a high power receiver. A signal detector output is coupled to the high power receiver.

Step 606 provides creating, by the signal detector, a shifted common mode version of the differential signal.

Step 608 provides calibrating, by the signal detector, the shifted common mode version of the differential signal so that a positive phase and a negative phase of the shifted common mode version of the differential signal have the same DC level, within a specified amount.

Step 610 provides determining, by the signal detector, an amplitude of the shifted common mode version of the differential signal.

Step 612 provides determining, by the signal detector, if the amplitude of the shifted common mode version of the differential signal is high enough to be in an active mode.

Step 614 provides, if step 612 determines that the amplitude of the shifted common mode version of the differential signal is high enough to be in an active mode, setting signal detector out to a value that enables high power circuitry in the high power receiver.

Step 616 provides, if step 612 determines that the amplitude of the shifted common mode version of the differential signal is not high enough to be in an active mode, setting signal detector out to a value that disables high power circuitry in the high power receiver.

Both Step 616 and Step 614 transfer control back to Step 612.

Figure 10:
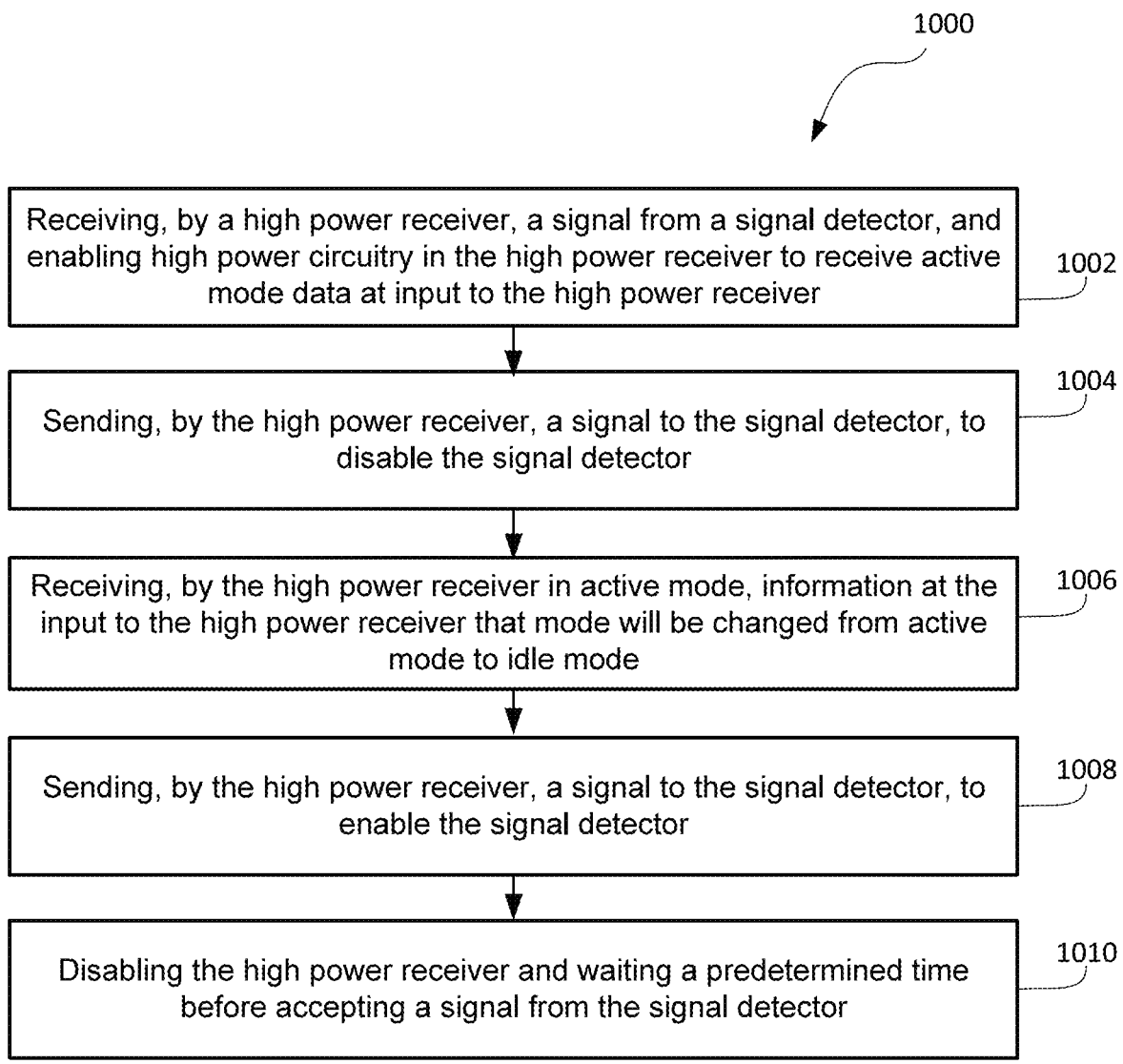
FIG. 10 shows a method used in embodiments having the signal detector disabled during active mode.

Method 1000 shown in FIG. 10 shows blocks for embodiments of the invention where the signal detector is disabled, to save power, during active mode.

In step 1002 a high power receiver with high power circuitry disabled is receiving a signal from the signal detector to enable high power circuitry in the high power receiver. The signal detector has detected a mode change from idle mode to active mode and the high power circuitry is enabled.

In step 1004, sending, by the high power receiver, a signal to the signal detector, to disable the signal detector. Active mode has been established, so there is, in this embodiment, no need for the signal detector to continue detecting the input signal to see if the signal input is now in active mode.

In step 1006, the high power receiver receives information at inputs to the high power receiver that the input signal is being switched to idle mode.

In step 1008, the high power receiver sends a signal to the signal detector to enable the signal detector.

In step 1010, the high power circuitry in the high power receiver is disabled. The high power receiver waits a predetermined time before accepting a signal from the signal detector, giving time for input signals to be in an idle mode and for the signal detector to correctly identify amplitude of the input signal to be in the idle mode. The predetermined time, or "blackout time", must be long enough for a particular transmitter protocol to transition into the idle mode and for the signal detector to correctly identify amplitude of the input signal to be in the idle mode.

What is claimed is:
1. An apparatus comprising:
a differential receiver to receive a differential signal having a first input for a plus phase and a second input for a minus phase of the differential signal, the differential receiver further comprising:
a high speed receiver further comprising a high power circuitry;
a signal detector to detect if the differential signal has transitioned from an idle mode to an active mode and configured to cause the high power circuitry to be enabled if the differential signal has transitioned from the idle mode to the active mode, the signal detector comprising:
a common mode shifter to shift an input common mode voltage of the differential signal to a programmable common mode level for a shifted differential signal;
an all-pass filter to pass a wide range of frequencies from the differential signal to the shifted differential signal; and
a decision block to compare an amplitude of the shifted differential signal with programmable reference inputs to the signal detector, and, if the amplitude of the shifted differential signal transitions increases past the amplitudes of the programmable reference inputs, is configured to send a signal to the high power receiver to enable the high power circuitry.

2. The apparatus of claim 1, the common mode shifter further comprising two identical circuits, a first circuit and a second circuit;
the first circuit comprising a first current source and a first common mode extraction resistor, the first common mode extraction resistor having a first end coupled to the first current source and a second end coupled to a first input of an amplifier;
the second circuit comprising a second current source and a second common mode extraction resistor, the second common mode extraction resistor having a first end coupled to the second current source and a second end coupled to the first input of the amplifier; and
the amplifier having a second input coupled to a common mode reference and an output coupled to the first and second current sources to control an amount of current supplied by the first and second current sources.

3. The apparatus of claim 2, the all-pass filter comprises a low frequency path in parallel with a high frequency path between the first and second inputs of the differential receiver and plus and minus phase nodes of the shifted differential signal comprising:
the high frequency path comprising a first capacitor coupled between the first input of the differential receiver and the plus phase node of the shifted differential signal and a first loading resistor coupled between the plus phase node of the shifted differential signal and ground, and a second capacitor coupled between the second input of the differential receiver and the minus phase node of the shifted differential signal and a second loading resistor coupled between the minus phase node of the shifted differential signal and ground;

the low frequency path comprising a first and a second identical low frequency path circuits:
the first low frequency path circuit comprising:
a first sense resistor coupled between the first input to the differential receiver and the first current source;
a first PFET (P-channel Field Effect Transistor);
a first inverting amplifier having an input between the first current source and a gate of the first PFET;
the first PFET having a source coupled to the first current source and a drain coupled to the plus phase node of the shifted differential signal;
the second low frequency path circuit comprising:
a second sense resistor coupled between the second input to the differential receiver and the second current source;
a second PFET;
a second inverting amplifier having an input between the second current source and a gate of the second PFET; and
the second PFET having a source coupled to the second current source and a drain coupled to the minus phase node of the shifted differential signal.

4. The apparatus of claim 3, the decision block comprising:
a first transconductance block and an identical second transconductance block,
the first transconductance block having a plus input to receive a first reference voltage for the minus phase node of the shifted differential signal, and a minus input to receive a second reference voltage for the plus phase node of the shifted differential signal, the first transconductance block having first and second outputs to output currents proportional to voltages on the plus and minus inputs to the first transconductance block;
the second transconductance block having a plus input to receive a voltage on the plus phase node of the shifted differential signal, and a minus input to receive a reference voltage for the minus phase node of the shifted differential signal, the second transconductance block having first and second outputs to output currents proportional to voltages on the plus and minus inputs to the second transconductance block,
a transimpedance amplifier (TIA) having a first input coupled to the first output of the first transconductance block, to the first output of the second transconductance block, and to a first resistor coupled between the first input of the TIA block and a first output of the TIA block, the TIA having a second input coupled to the second output of the first transconductance block, to the second output of the second transconductance block, and to a second resistor coupled between the second input of the TIA block and to a second output of the TIA block;
a comparator having a first input coupled to the first output of the TIA block and having a second input coupled to the second output of the TIA block, and an output having a first value when the first comparator input is greater than the second comparator input and a second value when the first comparator input is less than the second comparator input;
a circuit to determine a ratio of the first value and the second value over time; and
a Schmitt trigger having an input to receive the ratio of the first value and the second value over time and to output a signal detect out having an enable value to the high power receiver when the ratio of the first value and the second value over time has determined that the amplitude of the differential signal is greater than the amplitude between the first and second reference voltages, the enable value to cause enabling of the high power circuitry.

5. The apparatus of claim 4, the circuit to determine the ratio comprising a switch controlled by the comparator, a resistor, and a capacitor.

6. The apparatus of claim 4, further comprising a low pass filter between the first and second output of the TIA and the first and second input of the comparator.

7. The apparatus of claim 4, further comprising an offset calibration block coupled between the shifted differential signal plus node and the shifted differential signal minus node.

8. The apparatus of claim 7, the offset calibration block configured to reduce effects of mis-tracking of components coupled to the shifted differential signal plus node and the shifted differential signal minus node by transferring current between the shifted differential signal plus node and the shifted differential signal minus node.

9. The apparatus of claim 4, the high power receiver configured to respond to a second signal detect out value, different from the first signal detect out value, by disabling the high power circuitry.

10. The apparatus of claim 4, the high power receiver configured to, when active mode is established, disable the signal detector;
the high power receiver configured to, when the high power receiver receives information received from the differential signal that the differential signal is returning to idle mode, enable the signal detector.

11. The apparatus of claim 10, the high power receiver, after enabling the signal detector, configured to wait a predetermined time before accepting a signal from the signal detector to enable the high power circuitry.

12. A method comprising the steps of:
receiving, by a high power receiver, a signal from a signal detector, and enabling high power circuitry in the high power receiver to receive active mode data at an input to the high power receiver;
sending, by the high power receiver, a signal to the signal detector, to disable the signal detector;
receiving, by the high power receiver in active mode, information at the input to the high power receiver that mode will be changed from active mode to idle mode;
sending, by the high power receiver, a signal to the signal detector, to enable the signal detector;
disabling the high power receiver and waiting a predetermined time before accepting a signal from the signal detector;
calibrating, in the signal detector, the shifted common mode version of the differential signal so that both phases of the shifted common mode version of the differential signal have the same common mode voltage;
determining, by the signal detector, an amplitude of the shifted common mode version of the differential signal;
determining, by the signal detector, if the amplitude of the shifted common mode version of the differential signal is high enough to be in an active mode;
when the amplitude of the shifted common mode version of the differential signal is high enough to be in the active mode, setting a signal detector out signal to the high power receiver to enable high power circuitry in the high power receiver; and
when the amplitude of the shifted common mode version of the differential signal is not high enough to be in the active mode, setting a signal detector out signal to the high power receiver to disable the high power circuitry in the high power receiver.

* * * * *